(12) United States Patent
Hing

(10) Patent No.: US 6,529,840 B1
(45) Date of Patent: Mar. 4, 2003

(54) DEVICE FOR ESTIMATING THE STATE OF CHARGE OF A BATTERY

(75) Inventor: Sothun Hing, Le Mans (FR)

(73) Assignee: Cellon France, Le Mans Cedex (FR)

( * ) Notice: Subject to any disclaimer, the term of this patent is extended or adjusted under 35 U.S.C. 154(b) by 120 days.

(21) Appl. No.: 09/689,054

(22) Filed: Oct. 12, 2000

(30) Foreign Application Priority Data

Oct. 26, 1999 (FR) .............................................. 99 13361

(51) Int. Cl.$^7$ ................................................ G01R 31/36
(52) U.S. Cl. ........................................ 702/63; 324/430
(58) Field of Search ................................ 324/426, 430, 324/433, 427; 307/15; 320/108, 109, 110, 111, 112, 113, 114, 132, 136, 128, 143, 155, 161; 702/57, 63–65, 107, 117, 124, 126, 183, 184, 189, 177, 178, FOR 103, 118, 109, 120, 121, 104, 105, 106, 154, 156, 111, 170, 171

(56) References Cited

U.S. PATENT DOCUMENTS

| 4,017,724 | A | * | 4/1977 | Finger .................... 235/151.31 |
| 4,193,026 | A | * | 3/1980 | Finger et al. ................. 324/428 |
| 4,208,993 | A | * | 6/1980 | Peter ............................ 123/119 |
| 5,321,627 | A | * | 6/1994 | Reher ........................... 364/483 |
| 5,381,350 | A | * | 1/1995 | Fiorina et al. ............... 364/550 |
| 5,404,106 | A |   | 4/1995 | Matsuda ...................... 364/483 |
| 5,444,378 | A | * | 8/1995 | Rogers ......................... 324/428 |
| 5,596,260 | A | * | 1/1997 | Moravec et al. .............. 320/30 |
| 5,652,069 | A | * | 7/1997 | Sakai et al. .................... 429/92 |
| 6,064,180 | A | * | 5/2000 | Sullivan et al. ............. 320/132 |
| 6,134,453 | A | * | 10/2000 | Sainton ........................ 455/553 |

\* cited by examiner

*Primary Examiner*—Marc S. Hoff
*Assistant Examiner*—Edward Raymond
(74) *Attorney, Agent, or Firm*—Young & Thompson

(57) ABSTRACT

The invention relates to a device (1) for estimating the state of charge of a rechargeable battery (BAT) by means of a measuring circuit (MES). This measuring circuit has at least two initial threshold values corresponding to given states of charge of the battery and which, by comparison with the voltage on the terminals of the battery, permit to give an indication of the state of charge of the battery. The invention comprises making a correction of these initial threshold values as a function of an accumulated operating time of the battery so as to obtain a set of corrected threshold values. The voltage on the terminals of the battery is then compared with these corrected threshold values.

7 Claims, 3 Drawing Sheets

DEVICE FOR ESTIMATING THE STATE OF CHARGE OF A BATTERY

The invention relates to a device comprising at least:
a rechargeable battery,
a measuring circuit for producing a magnitude that represents a state of charge of the battery based on at least two initial threshold voltages such as a set of values defined by two consecutive initial threshold values and associated to a magnitude representing a respective state of charge of the battery.

The invention also relates to a radiotelephone including such a device.

The invention relates to a method of estimating a state of charge of a battery.

The present invention is particularly interesting in applications linked with mobile telephony.

A rechargeable battery operates in successive cycles of use, a cycle corresponding to a complete charge followed by a complete discharge of the battery. When a battery becomes older, it deteriorates and, after various cycles of use, shows operating features which are different from those of a new battery. A battery comprises electrodes or plates, which are oxidized during operation and modify the operation features of the battery. A charge estimation device of a battery is known from document U.S. Pat. No. 5,404,106. This document proposes a device, which permits to estimate a rest charge capacity independently of the state of degradation of positive and negative plates of the battery. The device includes a table memory indicating the rest charge capacity as a function of a measurement of the internal resistance of the battery and a measurement of discharging current. A problem of the device described in this document is to indicate a rest charge capacity relative to the initial total charge capacity of the battery before a deterioration of the plates. Thus, for example, after various cycles of use of the battery, such a device does not necessarily indicate a maximum charge capacity when the battery is charged.

It is an object of the invention to provide a device that permits a precise and real estimation of the state of charge of a battery as a function of current operating features of the battery.

For this purpose, the measuring circuit of the device as described in the opening paragraph produces said magnitude based on corrected threshold values obtained from a correction of initial threshold values as a function of an approximation of the accumulated operating time of the battery.

A device according to the invention permits to effect a measurement of the state of charge of a battery while taking the modifications of the features of the battery due to a succession of various cycles of use of the battery into account. In contrast to the device described in the prior-art document, the state of charge is measured relative to the total charge capacity of the battery at the instant of the measurement; this total charge capacity being modified during the operation of the battery. An advantage of a device according to the invention is that a user of the battery charge capacity is correctly informed at a given instant about the total charge capacity at the same instant, whatever the state of aging of the battery.

In a preferred embodiment of the invention, the approximation of the accumulated operating time of the battery is a function of a measurement of the internal resistance of the battery.

In an embodiment of the invention, the measuring device comprises:
means for measuring the voltage on the terminals of the battery
means for comparing the voltage on the terminals of the battery with the corrected threshold values and for producing said magnitude that represents the state of charge of the battery as a function of the result of this comparison.

In a general manner, the rest charge capacity in a battery at a given instant may be estimated on the basis of a measurement of the voltage on the terminals of the battery. A set of threshold values of this voltage that correspond to various states of charge of the battery is available in a memory. The voltage measured on the terminals of the battery is compared with these threshold values and a magnitude representing the corrected state of charge of the battery is derived from this comparison.

These and other aspects of the invention are apparent from and will be elucidated, by way of non-limiting example, with reference to the embodiment(s) described hereinafter.

Figure 1:
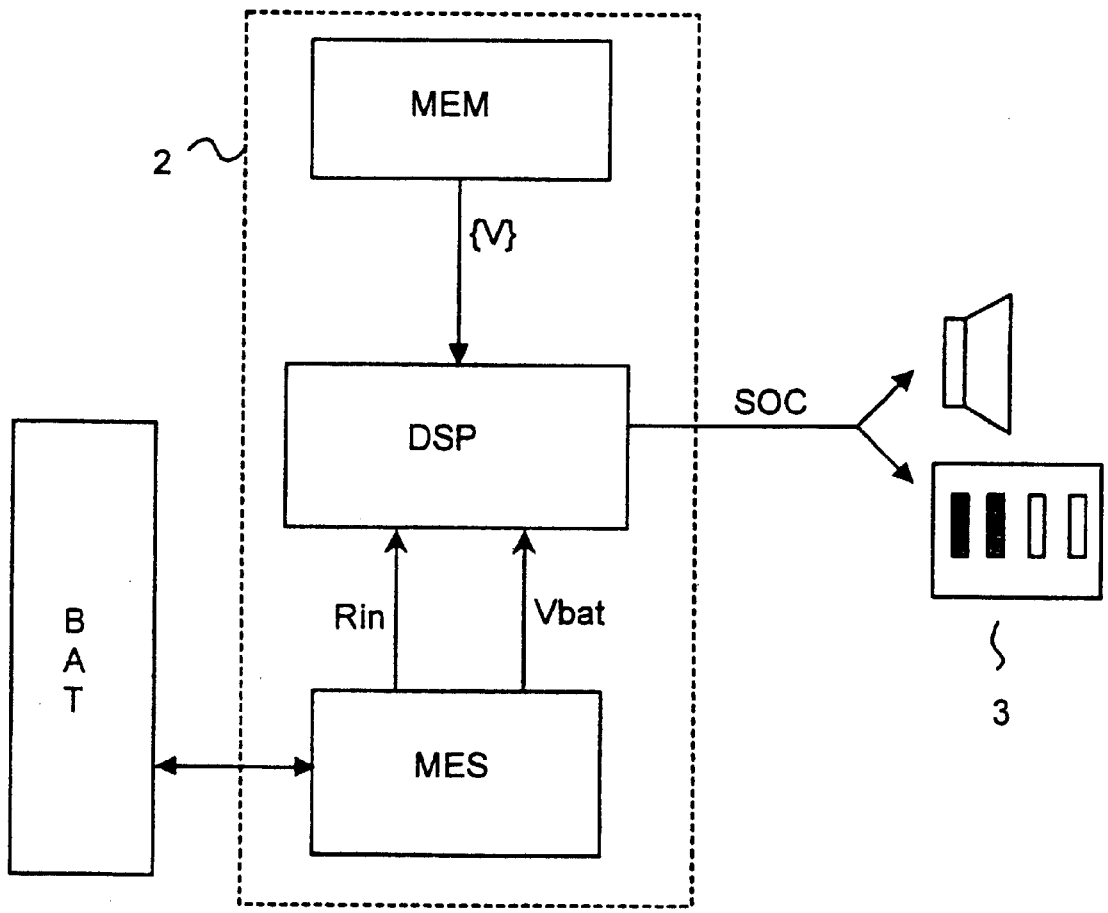
FIG. 1 is a block diagram of a device according to the invention.

An embodiment of a device 1 according to the invention is represented in FIG. 1. A device 1 according to the invention includes a rechargeable battery BAT of which a magnitude SOC is estimated representing its state of charge at a given instant. For this purpose, the device 1 includes a measuring circuit 2 for producing a magnitude SOC. The measuring circuit 2 includes measuring means MES for measuring the voltage Vbat on the terminals of the battery BAT and the internal resistance Rin of the battery. As explained earlier, the battery BAT deteriorates in the course of its operation as a result of loss of active material of the electrodes of the battery BAT. The consequence of this is an increase of the internal resistance Rin of the battery BAT. The evolution of this internal resistance Rin with time is a function of an approximation of the accumulated operating time T of the battery BAT. In the following the expression accumulated operating time will be used to denote an approximation of this accumulated operating time. This accumulated operating time T corresponds to the total operating time of the battery BAT since its first use. In an embodiment of the invention, the accumulated operating time T of the battery BAT may be evaluated according to the equation (1):

$$T = \frac{(\mathrm{Ln}(Rin) - \mathrm{Ln}(A))}{B} \tag{1}$$

where T is the accumulated operating time of the battery evaluated in a number of cycles of use of the battery BAT; A and B being constants.

The accumulated operating time T of the battery is estimated in a calculation circuit DSP. The calculation circuit DSP may further access a memory MEM in which are stored a set of threshold values {V} of the voltage Vbat on the terminals of the battery which permit to determine the magnitude SOC, the set {V} comprising at least two threshold values. The values of the voltage Vbat on the terminals of the battery, lying between two consecutive threshold values, are associated to a magnitude SOC that represents a given state of charge of the battery BAT. This set of threshold values {V} is associated to a given accumulated operating time T of the battery BAT. In this embodiment is considered that the threshold values {V} stored in the memory MEM come from a typical constant current discharge curve of the battery BAT at state nine, that is to say, for zero T. In this embodiment of the invention, the threshold values {V} are corrected in the calculation circuit DSP as a function of the accumulated operating time T of the battery BAT as described earlier. The magnitude SOC may then be transmitted to an indicator device 3 for visually displaying the magnitude SOC. The indicator device 3 may also be a light indicator, a sound indicator or any other indicator means.

Figure 2:
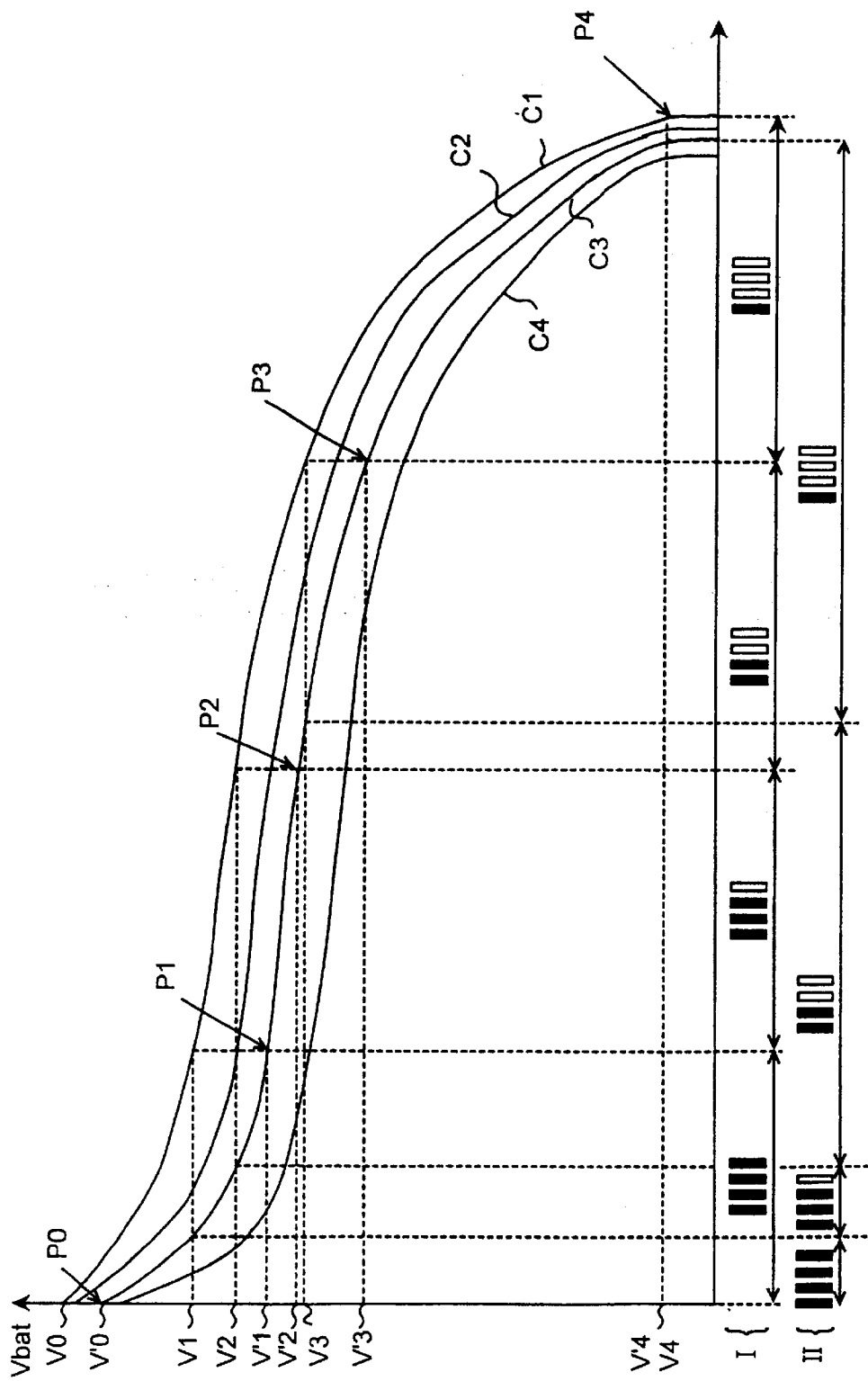
FIG. 2 shows discharging curves of a battery for various accumulated operating times of the battery.

The behavior of the battery BAT during various constant current discharges is represented by the discharge characteristics C1, C2, C3 and C4 of FIG. 2. The curves C1, C2, C3 and C4 indicate each for different accumulated operating times T during the constant magnitude SOC may be displayed in the form of four symbols comprising each four white or black parallel bars according to the state of charge of the battery, as represented in FIG. 1 by a situation I. When the measured voltage Vbat on the terminals of the battery BAT belong to ]V1,V0], a magnitude SOC represented by 4 black bars can be displayed. When the voltage Vbat belongs to the interval ]V2,V1], the state of charge of the battery BAT can be represented by 3 black bars and 1 white bar. When the voltage Vbat belongs to the interval ]V3,V2], the state of charge of the battery BAT can be represented by 2 black bars and 2 white bars. When the voltage Vbat belongs to the interval ]V4,V3], the state of charge of the battery BAT can be represented by 1 black bar and 3 white bars. When the voltage Vbat is lower than V4, the battery BAT is considered to be discharged.

In this paragraph the operation is discussed of the battery BAT after the accumulated operating time T3. When the threshold values V0, V1, V2, V3 and V4 as described in a preceding paragraph are used for estimating the state of charge of the battery BAT, a situation II is obtained. Actually, when the voltage Vbat on the terminals of the battery BAT lies between V1 and V0, the corresponding state of charge of the battery BAT can be represented by 4 black bars bars. Similarly, when the voltage Vbat belongs to the intervals ]V2,V1], ]V3,V2], ]V4,V3], the state of charge of the battery can be represented by 3 black bars and 1 white bar, 2 black bars and 2 white bars, 1 black bar and 3 white bars, respectively. Thus, based on the initial threshold values V0, V1, V2, V3, V4 determined when the battery BAT is new, the magnitude SOC obtained after an accumulated operating time T3 is an erroneous representation of the state of charge of the battery.

In an embodiment of the invention, the threshold values V0, V1, V2, V3, V4 are corrected as a function of the accumulated operating time T of the battery and corrected threshold values V'0, V'1, V'2, V'3 and V'4 are obtained for an accumulated operating time T3. In this embodiment of the invention the corrected threshold values V'0, V'1, V'2, V'3 and V'4 represented in FIG. 1 correspond to the ordinates of the points P0, P1, P2, P3, P4 of the curve C3 having respective abscissas representing each 4/4, 3/4, 2/4, 1/4, 0/4 of the total charge capacity of the battery BAT. Thus an estimation of the state of charge of the battery BAT at the end of an accumulated operating time T3 based on the corrected threshold values V'0, V'1, V'2, V'3, V'4 leads to situation I.

Figure 3:
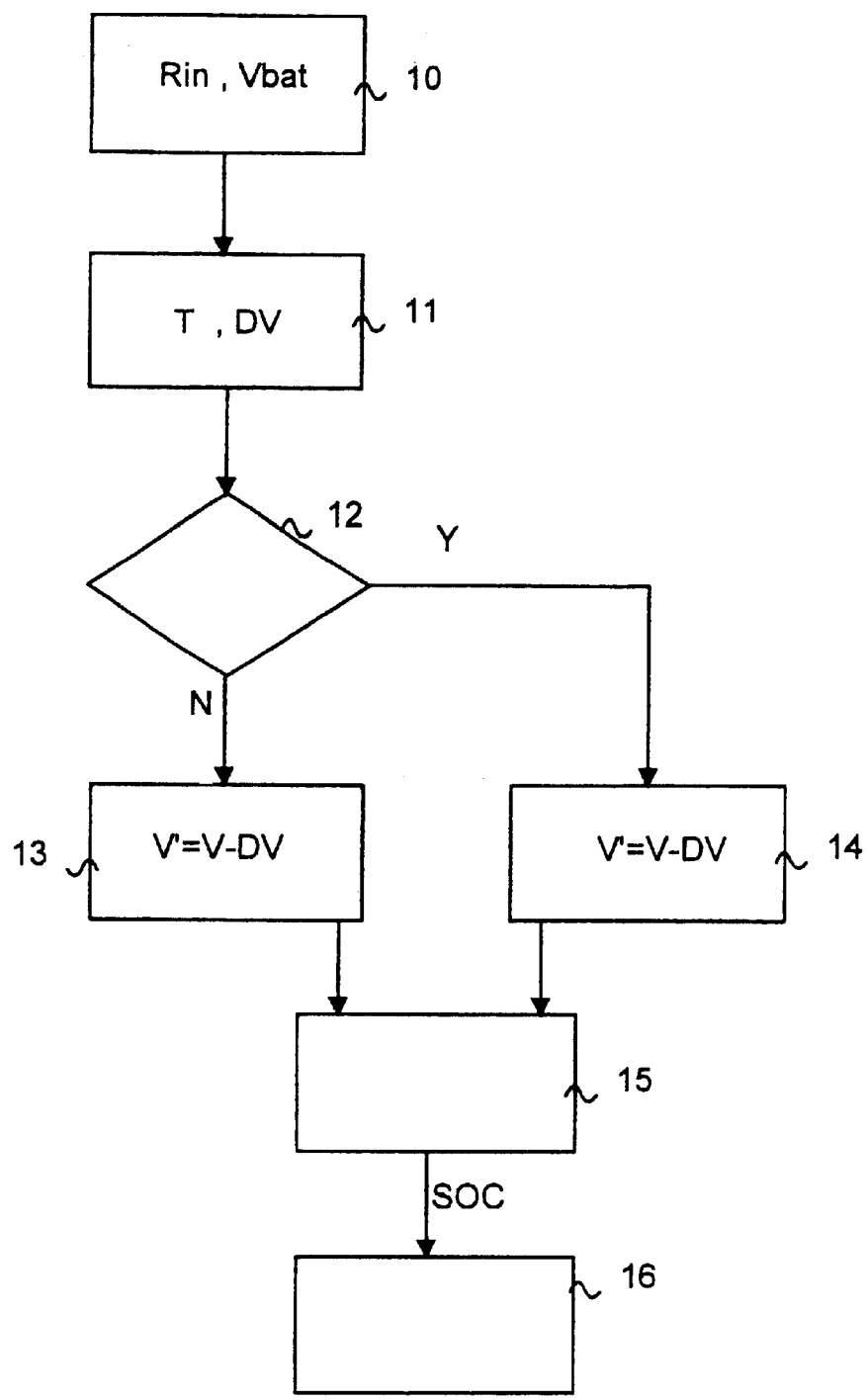
FIG. 3 shows various steps of a method according to the invention.

FIG. 3 shows various steps of a method according to the invention which method may be implemented in the device 1 of FIG. 2 for estimating the magnitude SOC which represents the state of charge of the battery BAT. A first step 10 comprises measuring the voltage Vbat on the terminals of the battery BAT and the internal resistance Rin of the current discharging of the battery BAT, the magnitude SOC that represents the state of charge of the battery BAT along the x-axis as a function of the voltage Vbat on the terminals of the battery BAT along the y-axis. In an embodiment, the magnitude SOC may, for example, be the ratio of charge of the battery at a given instant relative to the total possible charge capacity of the battery BAT at the same instant. Thus in this embodiment of the invention, the magnitude SOC is a real number lying between 0 and 1, 0 corresponding to a discharged battery BAT and 1 to a battery BAT charged to maximum capacity. The accumulated operating time T is here, for example, the total number of successive charge and discharge cycles of the battery and is representative of the state of aging of the battery. The curve C1 represents the discharging characteristic of the battery BAT for a zero accumulated operating time T1, that is to say, when the battery BAT is new. The curves C2, C3 and C4 represent the discharge characteristics of the battery BAT for non-zero accumulated operating times T2, T3 and T4 respectively, T2 being lower than T3 and T3 being lower than T4.

In order to evaluate the magnitude SOC, a measurement is made of the voltage Vbat on the terminals of the battery and the measured voltage Vbat is compared with an arbitrary number of initial threshold values {V}. In this embodiment of the invention, the threshold values V0, V1, V2, V3, V4 form the set {V} and are defined so that V0>V1>V2>V3>V4≧0. These initial threshold values V0, V1, V2, V3, V4 are fixed beforehand as a function of the discharge curve C1 of the battery when the battery BAT is new and stored in the battery's own or external memory. Beforehand, the threshold value V0 is chosen as the value of the voltage Vbat on the terminals of the battery BAT in the new state when the battery is charged to its maximum capacity. All the measurements of the voltage Vbat belonging to an interval bounded by two successive threshold values correspond to a value of said magnitude SOC that represents a given state of charge of the battery BAT. In an embodiment of the invention the initial threshold values V0, V1, V2, V3, V4 are fixed, so that each interval bounded by two successive threshold values represents 1/4 of the total charge of the battery when this is new. In an embodiment the maximum value V0 of the voltage of the battery BAT cannot be considered a threshold value. All the measurements of the voltage Vbat higher than V1 are thus equivalent to all the measurements of the voltage Vbat belonging to the interval ]V1;V0].

In an embodiment of the invention, this magnitude SOC may be a digital value. This magnitude SOC may also appear in the form of a character or a symbol representing a state of charge of the battery BAT. In an embodiment of the invention the battery. The voltage Vbat is measured by the measuring means MES. The measuring means MES further make a measurement of the voltage drop ΔV on the terminals of the battery BAT due to the various discharge systems which correspond each to a given value of the discharge current. The value of the internal resistance is derived from these measurements as the ratio of the voltage drop ΔV and of the difference ΔI of the corresponding discharge currents. In an embodiment where the device 1 is a radiotelephone, the measurement of the resistance Rin may be made during two different discharge modes such as a rest mode of the radiotelephone and a search mode for searching the network, for example. A second step 11 comprises estimating in the calculation circuit DSP the accumulated operating time T of the battery BAT based on the measurement of the internal resistance Rin by applying equation (1). The second step also comprises the calculation of a set of correcting deviations {DV} intended to be subtracted from each of the initial threshold values {V} to obtain a set of corrected threshold values {V'}. These correcting deviations are in a possible embodiment of the invention completely the same and estimated on the basis of the accumulated operating time T of the battery in the following manner:

$$DV = I \times T + J \times T^2 \quad (2)$$

with I and J being constants.

In a preferred embodiment of the invention, the battery may be used in various modes: a rest mode or an active mode, for example. Such a battery may be used in applications linked with radiotelephony. The radiotelephone, which may be represented by the device 1 according to the invention, may comprise a battery BAT which is in a rest mode when the radiotelephone does not transmit any communication, and otherwise in an active mode. Each mode is thus characterized by a different discharge curve and because of this a set of initial threshold values {V} such as described in a preceding paragraph is associated to each of the modes. A step 12 thus comprises determining the mode of use of the battery BAT. Then a step 13 associated, for example, to the mode called rest mode, or a step 14 associated to the mode called active mode, comprises accessing the set of the initial threshold values {V} corresponding to the mode of use of the battery. The corrected threshold values {V'} are obtained on the basis of these initial threshold values {V} by subtracting the previously calculated correction deviation DV from the initial threshold values {V}.

A step 15 comprises comparing the measured voltage Vbat with the corrected threshold values {V'} and deriving from this comparison the magnitude SOC that represents the state of charge of the battery BAT. Finally, a possible step 16 of a method according to the invention comprises signaling the magnitude SOC that represents the state of charge of the battery BAT to a user by way of sound or vision or in a touch-sensitive way.

The Figures proposed in this document need not be considered limitative with respect to the object of the invention. FIG. 1 proposes a particular embodiment of the invention and it is possible to design a battery for which the measuring circuit 2 is inside the battery.

It is appropriate to note that in this text the use of the verb "comprise" does not exclude the presence of elements or steps other than those listed in a claim.

Furthermore, it is also appropriate to note that with respect to the described method; any modification or improvement may be proposed without departing from the object of the invention. It is clear that the proposed method may be implemented in various ways, such as by means of electronic circuits, or, alternatively, by means of a set of instructions stored on an information carrier and which instructions can be executed under the control of a processor or a computer.

What is claimed is:

1. A device, comprising:

a rechargeable battery; and circuitry, coupled to the battery, adapted to measure the voltage of the battery under at least two current load conditions, determine the internal resistance of the battery based upon the measured voltage under the at least two current load conditions, generate an approximate accumulated operating time of the battery based upon the internal resistance, generate a set of correction values based upon the approximate accumulated operating time of the battery, generate a set of corrected threshold values based upon the correction values and an initial set of threshold values, and further adapted to generate an output signal having a magnitude that is representative of the state of charge of the battery;

wherein a first one of the two current load conditions corresponds to an active mode of the device and a second one of the two current load conditions corresponds to a rest mode of the device.

2. A device as claimed in claim 1, wherein the circuitry comprises a voltage measuring circuit coupled to a computational resource, and a memory coupled to the computational resource.

3. A device as claimed in claim 2, characterized in that the approximation of the accumulated operating time of the battery is defined by $$T = \frac{(\text{Ln}(Rin) - \text{Ln}(A))}{B}$$

where Rin is the measurement of the internal resistance and A and B are constants.

4. A device as claimed in claim 1, wherein the circuitry further comprises:

means for comparing the voltage of the battery with the corrected threshold values and for producing said magnitude that represents the state of charge of the battery as a function of the result of this comparison.

5. A radiotelephone comprising a device as claimed in claim 1 and a device for indicating said magnitude that represents the state of charge of the battery.

6. A method of estimating a state of charge of a battery coupled to a device, comprising:

measuring the voltage on the terminals of the battery while a first known current due to a first operational state of the device is drawn from the battery, and measuring the voltage on the terminals of the battery while a second known current due to a second operational state of the device is drawn from the battery;

determining the internal resistance of the battery;

determining an approximate operating time of the battery based upon the internal resistance of the battery;

generating one or more correcting deviations based upon the approximate operating time of the battery;

correcting a set of initial threshold values to obtain a set of corrected threshold values based upon the correcting deviations;

measuring a discharge voltage; and comparing the discharge voltage with the corrected threshold values to obtain the state of charge of the battery.

7. An information carrier comprising a program kernel for storing a series of instructions that can be executed under the control of a computer or a processor which permit to realize a part of the steps of a method as claimed in claim 6.

* * * * *